US008493117B2

(12) United States Patent
Sorna et al.

(10) Patent No.: US 8,493,117 B2

(45) Date of Patent: Jul. 23, 2013

(54) LEAKAGE TOLERANT DELAY LOCKED LOOP CIRCUIT DEVICE

(75) Inventors: Michael A. Sorna, Hopewell Junction, NY (US); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 13/295,351

(22) Filed: Nov. 14, 2011

(65) Prior Publication Data

US 2013/0120041 A1 May 16, 2013

(51) Int. Cl.
*H03L 7/06* (2006.01)

(52) U.S. Cl.
USPC .......... 327/158; 327/149

(58) Field of Classification Search
None
See application file for complete search history.

(56) References Cited

U.S. PATENT DOCUMENTS 6,130,552 A 10/2000 Jefferson et al.
6,140,854 A 10/2000 Coddington et al.
6,292,016 B1 9/2001 Jefferson et al.
6,950,484 B1 9/2005 Jordan et al.
7,282,973 B1 10/2007 Charagulla et al.
7,430,676 B2 9/2008 Baker et al.
2002/0175722 A1* 11/2002 Mano et al. .......... 327/156
2007/0247203 A1 10/2007 Cho et al.
2010/0141328 A1* 6/2010 Meninger et al. .......... 327/512
2010/0156459 A1 6/2010 Plants et al.
2010/0308922 A1 12/2010 Feng et al.

* cited by examiner

*Primary Examiner* — Cassandra Cox

(74) *Attorney, Agent, or Firm* — Brandon C. Kennedy; H. Daniel Schnurmann; Biggers & Ohanian, LLP

(57) ABSTRACT

Leakage tolerant delay locked loop (DLL) circuit devices and methods of locking phases of output phase signals to a phase of a reference signal using a leakage tolerant DLL circuit device are provided. Embodiments include a DLL circuit device comprising: a primary loop and a secondary correction circuit. The primary loop includes a phase detector, an error controller, and a voltage controlled buffer (VCB). The secondary correction circuit is configured to generate and provide secondary error-delay signals to the error controller. The secondary correction circuit includes multiple error generators. Each error generator is configured to generate a secondary error-delay signal in response to detecting a particular edge of an output phase signal from the VCB. The primary loop is configured to control a phase adjustment based on at least one of a first error-delay-increase signal, a first error-delay-decrease signal, and the secondary error-delay signals.

20 Claims, 8 Drawing Sheets

PRIOR ART

LEAKAGE TOLERANT DELAY LOCKED LOOP CIRCUIT DEVICE

BACKGROUND OF THE INVENTION

1. Field of the Invention

The field of the invention is data processing, or, more specifically, leakage tolerant delay locked loop (DLL) circuit devices and methods of locking phases of output phase signals to a phase of a reference signal using leakage tolerant DLL circuit devices.

2. Description of Related Art

A delay locked loop (DLL) circuit device is a control system that generates one or more output signals whose phase is delayed and locked relative to a phase of an input reference signal. For further explanation, FIG. 1 sets forth a diagram of a DLL circuit device found in the prior art. In the DLL circuit device of FIG. 1, the phase difference between a reference signal (118) and a feedback signal (128) is translated by a phase detector (102) into two signals, increase delay signal (120) and decrease delay signal (122). The two signals (120, 122) control a charge pump (104) that steers current into or out of a filter capacitor (106) via a filter control signal (124), causing the voltage across the filter capacitor (106) to increase or decrease. In each cycle, the time during which the charge pump (104) is turned-on is proportional to the phase difference between the reference signal (118) and the feedback signal (128). Hence, the charge delivered by the charge pump (104) is also dependent on the phase difference. The voltage on the filter capacitor (106) is used to control voltage controlled buffers (VCB) (108), which increase or decrease the delay of phases of the output phase signals (130) and the feedback signal (128) relative to a phase of the reference signal (118). That is, the filter capacitor (106) is instrumental in controlling how efficiently the VCB (108) and the DLL circuit device, as a whole, is able to delay the phases of the output phase signals (130) relative to the phase of the reference signal (118).

In an effort to control costs or reduce the size of the components with DLL circuit devices, manufacturers may select a filter capacitor with poor leakage characteristics. A leaky filter capacitor may discharge some of its charge during the operation of the DLL circuit device. Because a DLL circuit device relies on the charge of its filter capacitor to indicate to a VCB an amount to delay phases of output phase signals and a feedback signal, a leaky filter capacitor may cause the VCB to not delay the output phase signals and the feedback signal by the phase difference determined by the phase detector. That is, a leaky filter capacitor could increase the number of frequency cycles that the DLL circuit device must operate to delay and lock the phases of the output phase signals to a phase of a reference signal. In some instances, the degree of leakage in the filter capacitor may prevent a DLL circuit device from completely phase locking the output phase signals to the reference signal.

For further explanation, FIG. 2 sets forth a diagram illustrating a transient response of the DLL circuit device of FIG. 1, configured with a leaky filter capacitor. As explained above, the goal of a DLL circuit device is to delay and lock phases of output phase signals and a feedback signal relative to a phase of a reference signal. For example, the DLL circuit device of FIG. 1 may be programmed to delay and lock the feedback signal (128) by three hundred and sixty degrees relative to the reference signal (118).

The transient response of FIG. 2 illustrates the reference signal (118) and the feedback signal (128) at multiple time points (250-257) over time (290). At the time point (250), the feedback signal (128) is delayed relative to the reference signal (118) but there is still a phase difference between the two signals (118, 128). That is, the rising edge of the feedback signal (128) begins at the time point (250) and the next rising edge of the reference signal (118) begins at the time point (251). In response to detecting this difference between the two signals (118, 128), the phase detector (102) generates the increase delay signal (120) during the two time points (250, 251) and the charge pump provides a corresponding charge to the filter capacitor (106). During the time points (250, 251), the VCB control signal (126) is generated that corresponds to the charge of the filter capacitor (106). However, between the time point (251) and the time point (252), the increase delay error signal (120) is not generated and the charge pump (104) does not continue to charge the filter capacitor (106). In the example of FIGS. 1-2, the reference plate of the filter capacitor (106) is coupled to a low potential or ground, hence leakage in the filter capacitor (106) occurs in that direction. Because the filter capacitor (106) is leaky, the filter capacitor (106) begins to discharge and thus the VCB control signal (126) begins to decrease. In fact, at the time point (252), the filter capacitor (306) is at substantially the same charge it was at before the time point (250). As a consequence of the filter capacitor (306) discharging, the delay of the feedback signal (128) is not increased and the same increase delay signal (120) is generated between time points (252-257). That is, the leakage in the filter capacitor (106) prevents the DLL circuit device of FIG. 1 from completing the delay and locking of the phases of the phase output signals (130) and the feedback signal (128) to a phase of the reference signal (118).

SUMMARY OF THE INVENTION

Leakage tolerant delay locked loop (DLL) circuit devices and methods of locking phases of output phase signals to a phase of a reference signal using leakage tolerant DLL circuit devices are provided. Embodiments include a leakage tolerant DLL circuit device that includes a primary loop that includes a phase detector, an error controller, and a voltage controlled buffer (VCB). The primary loop is configured to generate a feedback signal having a phase that is delayed relative to a reference signal. The VCB is configured to generate a plurality of output phase signals and provide to the feedback signal to the phase detector. The phase detector is configured to generate and provide to the error controller, one of a first error-delay-increase signal and a first error-delay-decrease signal.

The DLL circuit device also includes a secondary correction circuit that includes multiple error generators. The secondary correction circuit is configured to generate and provide secondary error-delay signals to the error controller. Each error generator is configured to generate a secondary error-delay signal in response to detecting a particular edge of an output phase signal from the VCB. The primary loop is also configured to control a phase adjustment provided by the VCB to each of the output phase signals and the feedback signal. The primary loop is configured to control the phase adjustment based on at least one of the first error-delay-increase signal, the first error-delay-decrease signal, and the secondary error-delay signals. The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION OF EXEMPLARY EMBODIMENTS

Figure 3:
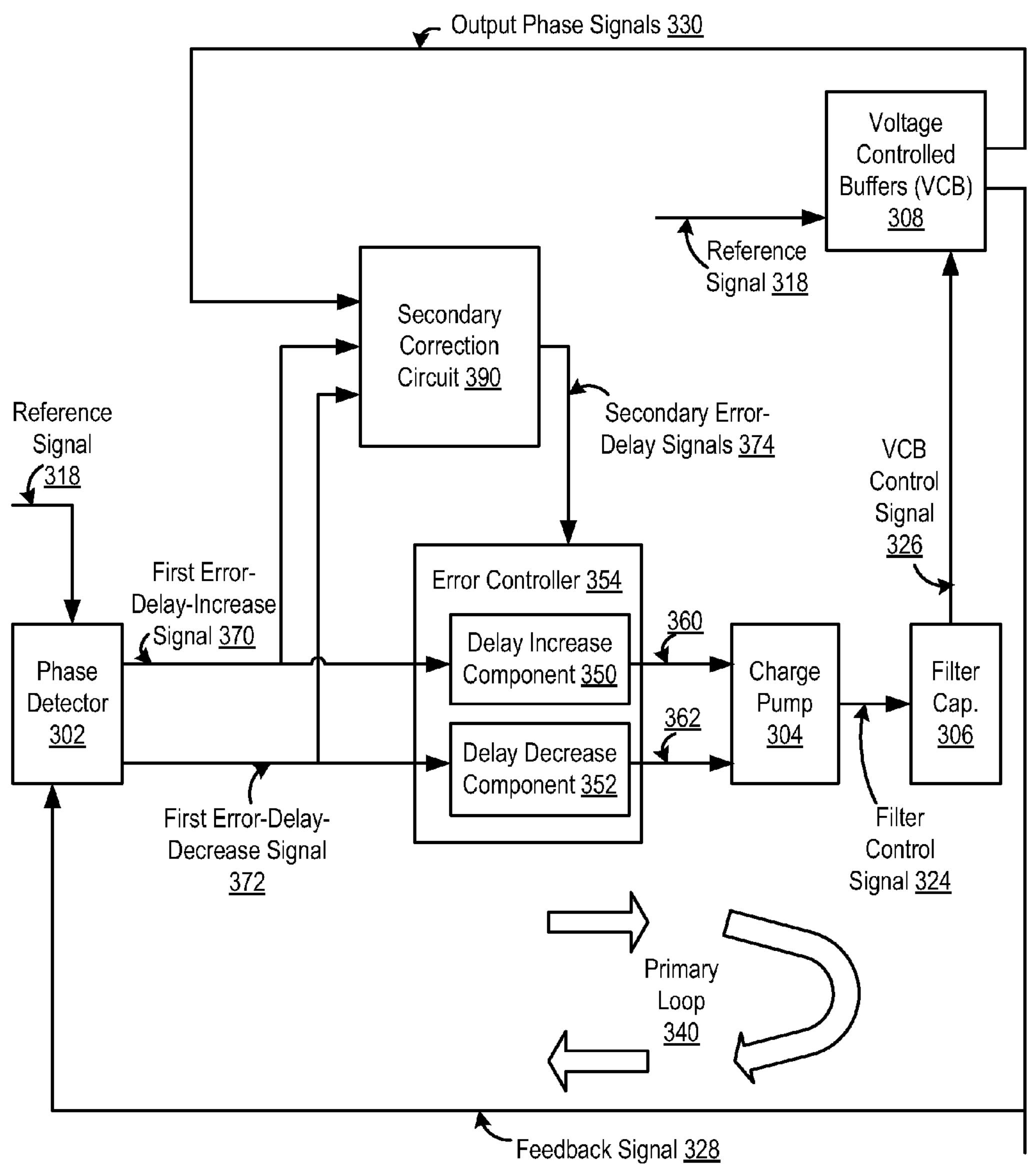
FIG. 3 sets forth a diagram of an example of a leakage tolerant DLL circuit device configured according to embodiments of the present invention.

Exemplary leakage tolerant delay locked loop (DLL) circuit devices and methods of locking phases of output phase signals to a phase of a reference signal using leakage tolerant DLL circuit devices in accordance with the present invention are described with reference to the accompanying drawings, beginning with FIG. 3. FIG. 3 sets forth a diagram of an example of a leakage tolerant DLL circuit device configured according to embodiments of the present invention. The DLL circuit device of FIG. 3 includes a primary loop (340) and a secondary correction circuit (390). The primary loop (340) includes a phase detector (302), an error controller (354), a charge pump (304), a filter capacitor (306), and voltage controlled buffers (308).

The filter capacitor (306) may be implemented in a number of different ways according to embodiments of the present invention. For example, in one embodiment, the filter capacitor (306) is tied to a reference potential. In another embodiment, the filter capacitor (306) may be a differential filter that has at least one capacitor and two control signal points.

Voltage controlled buffers (VCB) may include one or more delay elements that are each configured to delay an input signal. Delay elements within the VCBs (308) of FIG. 3 may delay a reference signal (318) by a set amount. For example, if the DLL circuit device of FIG. 3 is programmed to delay a reference signal by three hundred and sixty degrees, the VCBs (308) may include a series of eight delay elements that each delay the reference signal by forty-five degrees. A delay element may be implemented with tail devices that translate to current, a gate voltage created by the VCB control signal (326) or a derivative of the VCB control signal (326), hence, controlling the delay of the element by the current passing through it. That is, each delay element of the VCBs (308) may delay the reference signal (318) to a particular time point within the reference signal cycle. An output phase signal of each delay element may be taken from one or more of the delay elements of the VCBs (308). In the example of FIG. 3, the VCBs (308) generate the output phase signals (330) and a feedback signal (328). The feedback signal (328) is the sum of all the delay created by the delay elements within the VCBs (308). Thus, the feedback signal (328) and output phase signals (330) are signals with the same frequency but different phases of the reference signal (318).

A phase detector is a circuit that generates a voltage signal which represents the difference in phase between two signal inputs. The voltage signal generated by the phase detector (302) may be an analog signal or a digital signal. In the DLL circuit device of FIG. 3, the phase detector (302) is configured to translate the phase difference between the reference signal (318) and the feedback signal (328) into either a first error-delay-increase signal (370) or a first error-delay-decrease signal (372). The phase detector (302) generates the first error-delay-increase signal (370) if the comparison between the reference signal (318) and the feedback signal (328) indicates that the delay adjustment provided by the VCBs (308) should be increased. The duration of the first error-delay-increase signal (370) depends on the phase difference of the feedback signal (328) leading the reference signal (318). The phase detector (302) generates the first error-delay-decrease signal (372) if the comparison between the reference signal (318) and the feedback signal (328) indicates that the delay adjustment provided by the VCBs (308) should be decreased. The duration of the first error-delay-decrease signal (372) depends on the phase difference of the feedback signal (328) lagging behind the reference signal (318). The phase detector generates either the first error-delay-increase signal (370) or the first error-delay-decrease signal (372) only once per reference cycle because it compares the reference cycle (318) to the feedback signal (328) on a particular edge, which occurs only once per cycle. The first error-delay-increase signal (370) and the first error-delay-decrease signal (372) are provided to the error controller (354).

In the example of FIG. 3, the error controller (354) includes a delay increase component (350) and a delay decrease component (352). The delay increase component (350) is coupled to receive the first error-delay-increase signal (370) and to provide an increase charge indication (360) to the charge pump (304). In the example of FIG. 3, the VCB (308) is designed such that an increased charge (hence, higher voltage on the VCB control signal (326)) leads to an increased VCB delay. In another embodiment, the VCB (308) may be designed for opposite functionality in which a decrease charge indication leads to increased VCB delay. The delay decrease component (352) is coupled to receive the first error-delay-decrease signal (372) and to provide a decrease charge indication (362) to the charge pump (304). In the example of FIG. 3, either the delay increase component (350) or the delay decrease component (352) is coupled to the secondary correction circuit (390) to receive secondary error-delay signals (374) that can impact the pulse width and duration of any increase charge indications (360) or decrease charge indications (362) that the error controller (354) provides to the charge pump (304).

The charge pump (304) of FIG. 3 is configured to steer current into or out of the filter capacitor (306) via a filter control signal (324), causing the voltage across the filter capacitor (306) to increase or decrease. In each cycle, the time during which the charge pump (304) is turned-on is proportional to the phase difference between the reference signal (318) and the feedback signal (328). Hence, the charge delivered by the charge pump (304) is also dependent on the phase difference between the reference signal (318) and the feedback signal (328). However, as explained above, if the filter capacitor (306) leaks charge, then the VCB control signal (326) provided to the VCBs (308) may not indicate the correct amount that the VCBs (308) should delay the reference signal (318).

The secondary correction circuit (390) of FIG. 3 is configured to provide the secondary error-delay signals (374) to help the error controller (354), charge pump (304), and filter capacitor (306) maintain the charge within the filter capacitor (306). In the example of FIG. 3, the secondary correction circuit (390) is configured to receive the outputs phase signals (330) from the VCBs (308) and in response to detecting a particular edge of an output phase signal from the VCB (308), generate a secondary error-delay signal. For example, if the secondary correction circuit (390) detects the first error-delay-increase signal (370) or the first error-delay-decrease signal (372), then the secondary correction circuit (390) will generate a secondary error-delay signal each time that a particular edge is detected on each of the ensuing output phase signals (330). Because the output phase signals (330) have phases that are spread out over a cycle of a reference signal, the secondary correction circuit (390) may generate a set number of secondary error-delay signals (374) per reference cycle. That is, the error controller (354) may receive within a single reference signal cycle, a first error-delay-increase signal (370) or a first error-delay-decrease signal (372) and multiple secondary error-delay signals (374).

As indicated above, either the delay increase component (350) or the delay decrease component (352) is configured to receive the secondary error-delay signals (374). For example, in one embodiment, the delay increase component (350) is configured to receive the first error-delay-increase signal (370) and the secondary error-delay signals (374) and the delay decrease component (352) is configured to only receive the first error-delay-decrease signal (372). In another embodiment, the delay increase component (350) is configured to only receive the first error-delay-increase signal (370) and the delay decrease component (352) is configured to receive the first error-delay-decrease signal (372) and the secondary error-delay signals (374). Determining which delay component (350, 352) to couple to the secondary correction circuit (390) depends upon the direction that the filter capacitor (306) leaks. Filter capacitor leakage leads to control voltage degradation towards the other potential of the capacitor. The direction of the polarity of the secondary correction circuit (390) (i.e., which delay component (350, 352) the secondary correction circuit (390) is coupled) is selected such that the filter capacitor (306) voltage is moved in a direction away from its other plate potential. For example, if the filter capacitor (306) degradation leads to a reduced delay, the secondary correction circuit (390) may be coupled to the delay increase component (350) to increase the delay. However, if the filter capacitor (306) degradation leads to an increased delay, then the secondary error-delay signals may be coupled to the delay decrease component (352) to slow down the delay.

The secondary error-delay signals (374) increase or decrease delay by indicating to either the delay increase component (350) or the delay decrease component (352) to instruct the charge pump (304) to provide charge more frequently to the filter capacitor (306). That is, initially the charge pump (304) charges the filter capacitor (306) for a specific duration each reference cycle based on either the first error-delay-increase signal (370) or the first error-delay-decrease signal (372). However, after the VCBs (308) generate the phase output signals (330), the secondary correction circuit (390) will generate a secondary error-delay signal pulse periodically throughout a reference cycle. The error controller (354) uses the secondary error-delay signals (374) to instruct the charge pump to steer current into the filter capacitor (306) periodically through the reference cycle. By periodically recharging the filter capacitor (306), the leakage of the filter capacitor (306) may be offset and the VCBs (308) may receive VCB control signals (326) that instruct the VCBs (308) to provide the proper delay adjustment to its delay elements. That is, the DLL circuit of FIG. 3 reduces or fully compensates the negative effect of excessive filter capacitor leakage.

Figure 4:
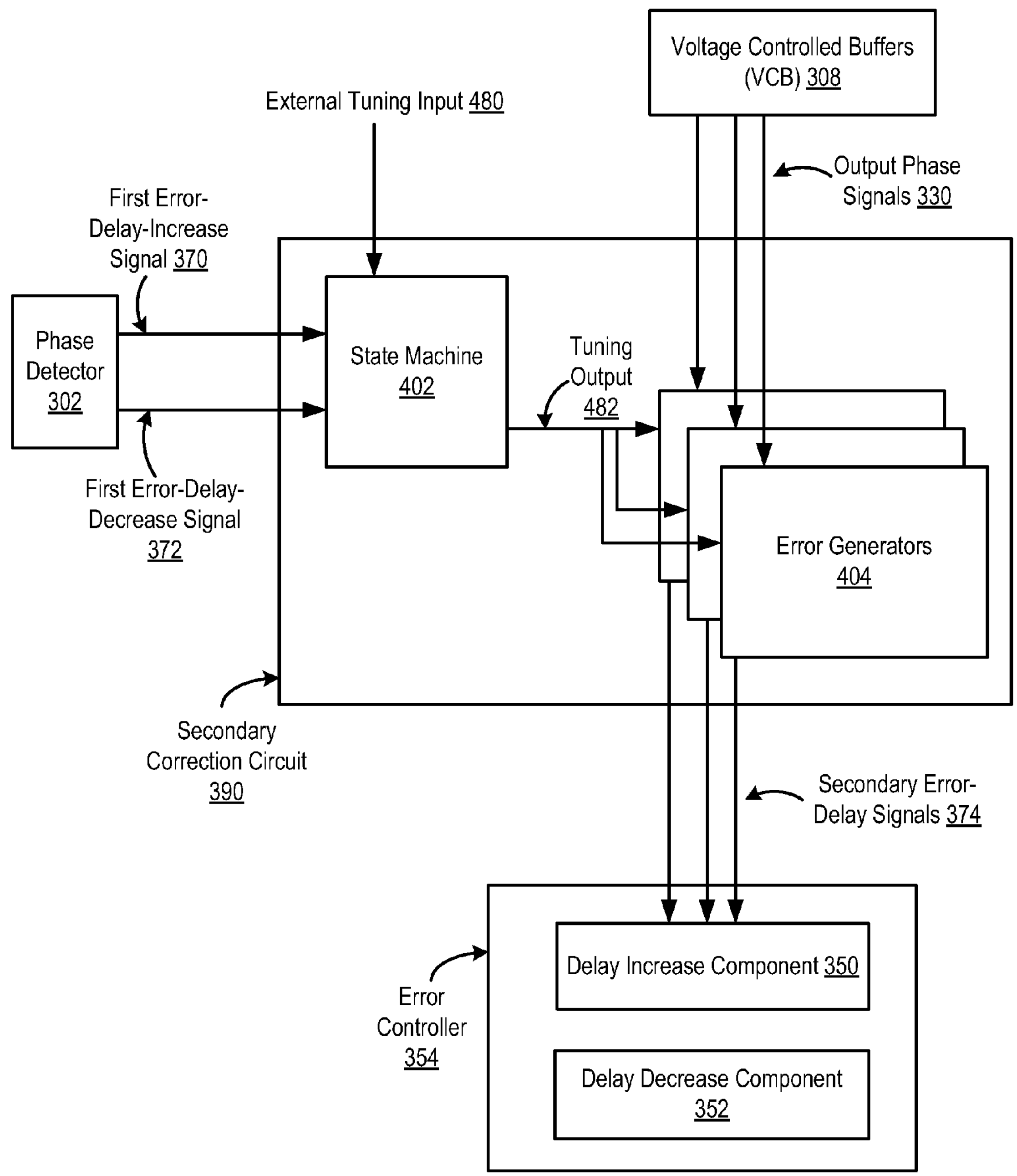
FIG. 4 sets forth a diagram of another example of a leakage tolerant DLL circuit device configured according to embodiments of the present invention.

FIG. 4 sets forth a diagram of another example of a leakage tolerant DLL circuit device configured according to embodiments of the present invention. The secondary correction circuit (390) of FIG. 4 includes a state machine (402) and multiple error generators (404).

In the example of FIG. 4, the state machine (402) is coupled to the phase detector (302) and to each error generator (404), each of which is coupled to one of the delay increase component (350) and the delay decrease component (352). Whether the error generators (404) are coupled to the delay increase component (350) or the delay decrease component (352) may be based on the configuration of the filter capacitor (306) and the VCB (308).

For example, in a first DLL circuit device configuration in which the filter capacitor (306) has a reference that is coupled to a lower potential and the VCB (308) is designed to increase delay in response to a rising VCB control signal (326), the secondary error-delay signals may be coupled to the delay increase component (350). In a second DLL circuit device configuration in which the filter capacitor (306) has a reference that is coupled to a higher potential and the VCB (308) is designed to increase delay in response to a falling VCB control signal (326), the secondary error-delay signals may be coupled to the delay increase component (350). In a third DLL circuit device configuration in which the filter capacitor (306) has a reference that is coupled to a lower potential and the VCB (308) is designed to decrease delay in response to a rising VCB control signal (326), the secondary error-delay signals may be coupled to the delay decrease component (352). In a fourth DLL circuit device configuration in which the filter capacitor (306) has a reference that is coupled to a higher potential and the VCB (308) is designed to decrease delay in response to a decreasing VCB control signal (326), the secondary error-delay signals may be coupled to the delay decrease component (352).

The state machine (402) may be configured to control the width of the secondary error delay signals (374). In the example of FIG. 4, the state machine (402) is configured to receive the first error-delay-increase signal (370) and the first error-delay-decrease signal (372) and apply a state control process. The state control process of the state machine (402) may include the state machine increasing or decreasing a tuning output (482) based on the previous tuning output of the state machine and based on whether the first error-delay-increase signal (370) or the first error-delay-decrease was received. The error generators (404) may use the tuning output (482) to adjust the width of the secondary error-delay signals (374).

For example, if the state machine (402) is in a first state and the first error-delay-increase signal (370) is received, the state machine (402) may generate a tuning output (482) that instructs the error generators (404) to generate secondary error-delay signals (374) of a first pulse width. Continuing with this example, if the state machine (402) during the next reference cycle receives again the first error-delay-increase signal (370), the state machine (402) may move to a second state and generate a tuning output that instructs the error generators to generate secondary error-delay signals (374) of a second pulse width that depends on the configuration of the DLL circuit device. For example, in the first DLL circuit device configuration and the fourth DLL circuit device configuration, if the first error-delay-increase signal (370) is received, then the state machine (402) may advance to the next higher state up to the highest state, where each higher state generates a tuning output instructing the error generators to generate secondary error-delay signals with larger pulse widths. Likewise in these two configurations, if the first error-delay-decrease signal (372) is received, then the state machine (402) may move to the next lower state down to the lowest state. In the second DLL circuit device configuration and the third DLL circuit device configuration, if the first error-delay-decrease signal (372) is received, then the state machine (402) may advance to the next higher state up to the highest state. Likewise in these two configurations, if the first error-delay-increase signal (370) is received, then the state machine (402) may move to the next lower state down to the lowest state. The state machine (402) may be configured to have any number of states with any amount of granularity between pulse width adjustments. Increasing the states also enables a more precise eventual settling of reference signal (318) with respect to the edge of feedback signal (328) over more reference clock cycles.

In the example of FIG. 4, the state machine (402) is also configured to receive an external tuning input (480). In response to receiving the external tuning input (480), the state machine (402) becomes bypassed, which gives a user the ability to control the tuning output (482), hence the delay of the programmable buffer (560) in the error generators (404) (and hence the pulse width of the secondary error-delay signals (374)). That is, activating the external tuning input (480) stops the secondary correction circuit's automated cycle-to-cycle width adjustment of the secondary error-delay signals (374), which may be useful, for example, during debugging operations of the DLL circuit device.

Each error generator (404) of FIG. 4 is coupled one of the output phase signals (330) and to the tuning output (482) and generates a secondary error-delay signal. As explained above, the error generators may be configured to detect a particular edge of an output phase signal and in response to the detection, generate a secondary error-delay signal having a pulse width controlled by the tuning output (482). By generating secondary error-delay signals with adjustable pulse widths, the secondary correction circuit (390) of FIG. 4 has greater control over the amount of charge provided by the charge pump (304) to the filter capacitor (306) and therefore greater control over the amount of delay provided by the VCBs (308).

Figure 5:
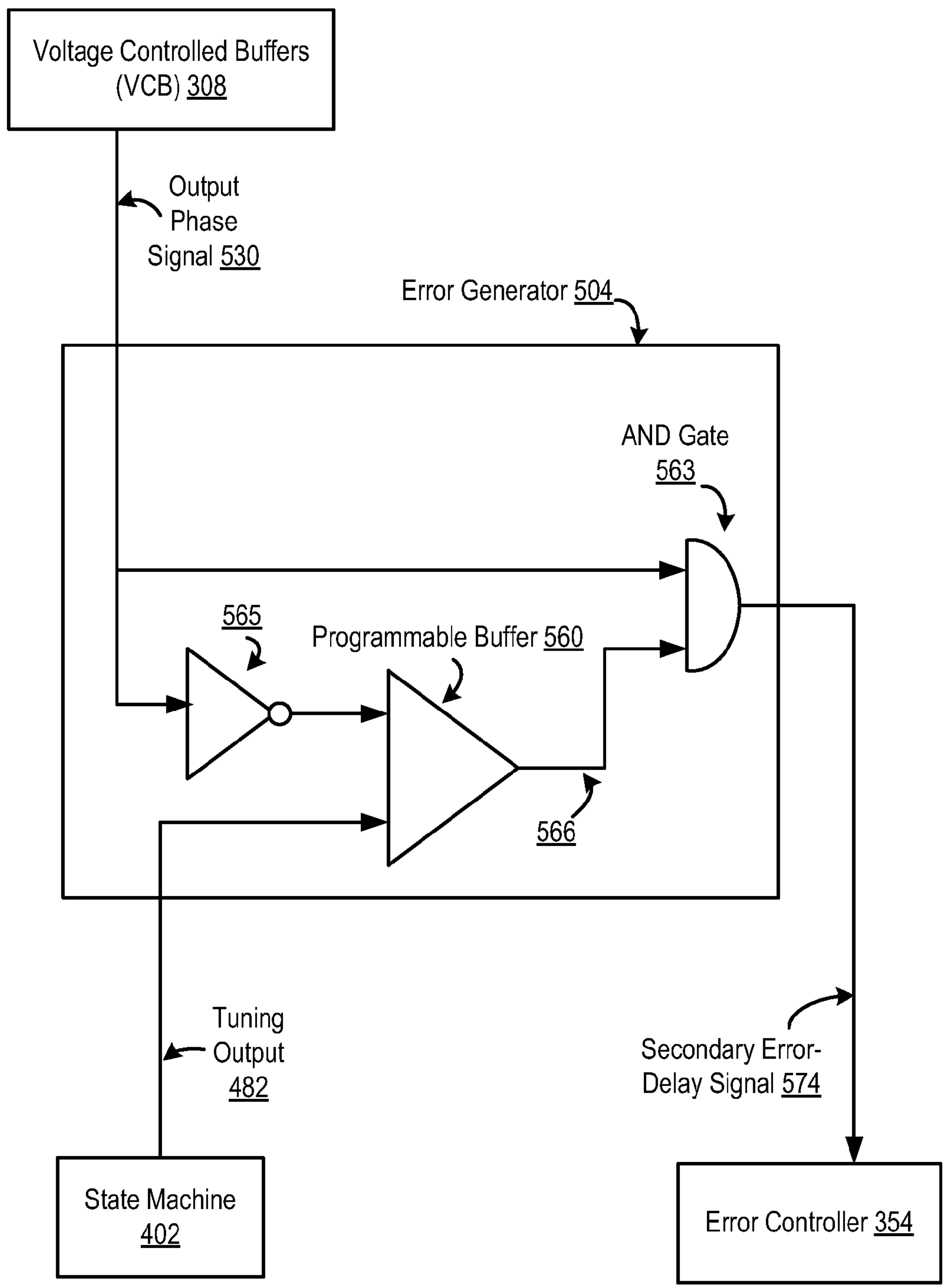
FIG. 5 sets forth a diagram of another example of a leakage tolerant DLL circuit device configured according to embodiments of the present invention.

FIG. 5 sets forth a diagram of another example of a DLL circuit device configured according to embodiments of the present invention. In the example of FIG. 5, one embodiment of an error generator is illustrated. That is, the circuitry of the error generator (504) is provided as an example. Readers of skill in the art realize that that any number of logical components may be implemented to generate a secondary error-delay signal having a particular pulse width controlled by the tuning output (482) of the state machine (402).

In the example of FIG. 5, the error generator (504) acts as a programmable rising-edge pulse generator that generates a pulse in response to a rising edge of the output phase signal (530). The error generator (504) includes an inverter (565) that receives an input from an output phase signal (530). The output of the inverter (565) is provided to a programmable buffer (560) which also receives as an input, the tuning output (482). Based on the tuning output (482), the programmable buffer (560) generates a signal (566) that is input into an AND gate (563) along with the output phase signal (560) to generate the secondary error-delay signal (574), which is provided to the error controller (574). In another embodiment, a programmable falling-edge pulse generator may be utilized. For example, the AND gate (563) may be replaced with a NOR gate.

Figure 6:
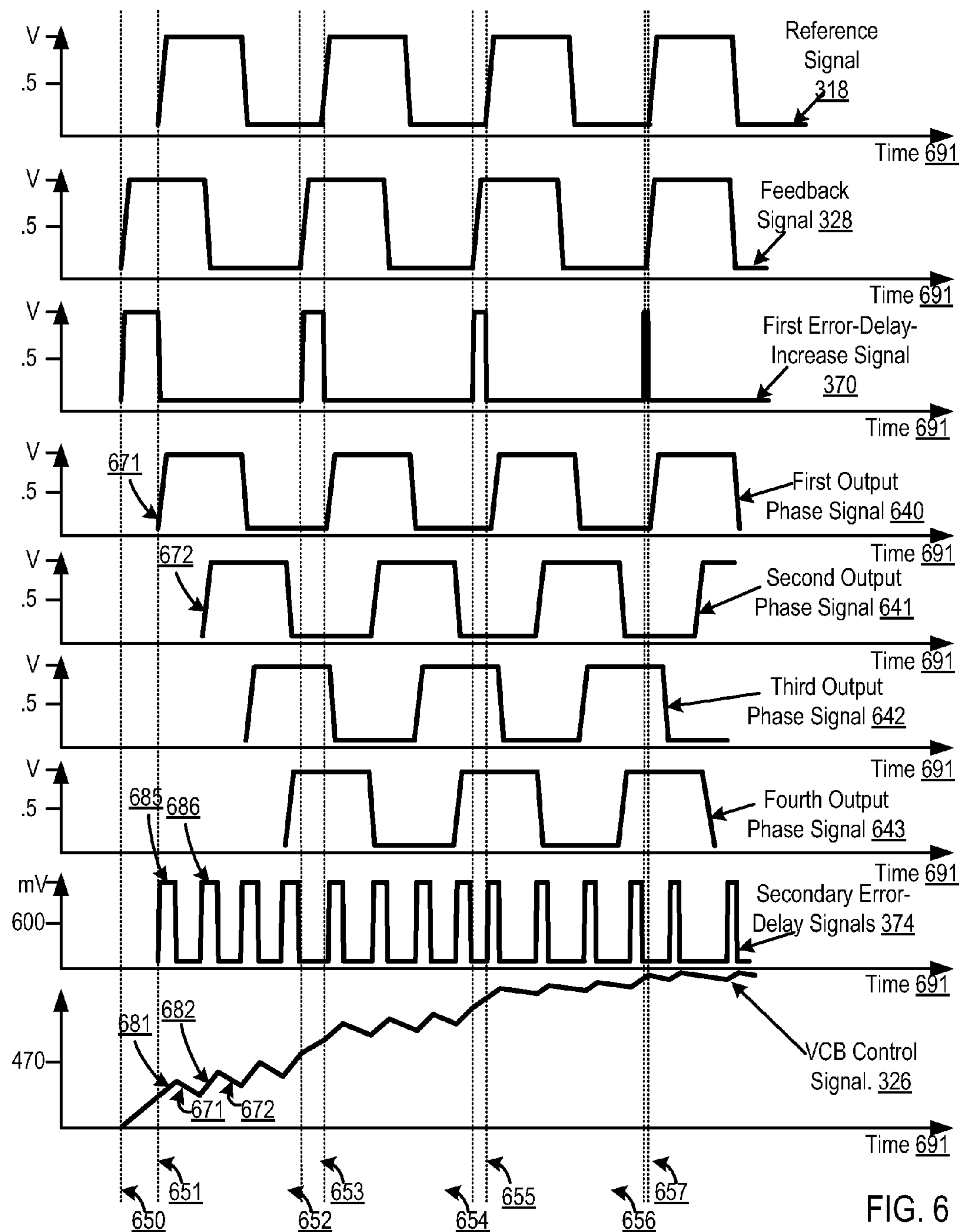
FIG. 6 sets forth a diagram illustrating an example of a transient response of a leakage tolerant DLL circuit device configured according to embodiments of the present invention.

FIG. 6 sets forth a diagram illustrating an example of a transient response of a leakage tolerant DLL circuit device configured according to embodiments of the present invention. As explained above, the goal of a DLL circuit device is to delay and lock phases of output phase signals and a feedback signal relative to a phase of a reference signal. For example, the leakage tolerant DLL circuit device of FIG. 3 may be programmed to delay and lock the feedback signal (328) by three hundred and sixty degrees relative to the reference signal (318). The transient response of FIG. 6 illustrates the reference signal (318) and the feedback signal (328) at multiple time points (650-657) over time (691). At the time point (650), the feedback signal (328) is delayed relative to the reference signal (318) but there is still a phase difference between the two signals. That is, the rising edge of the feedback signal (328) begins at the time point (650) and the next rising edge of the reference signal (318) begins at the time point (651). In response to detecting this difference between the two signals, the phase detector (302) generates the first error-delay-increase signal (370) during the two time points (650, 651) and the charge pump provides a corresponding charge to the filter capacitor (306). During the time points (650, 651), a VCB control signal (326) is generated that corresponds to the charge of the filter capacitor (306). Between the time point (651) and the time point (652), the first error-delay-increase signal (370) is not generated but secondary error-delay signals (374) are generated.

As explained above, the secondary error-delay signals (374) are used to offset the filter capacitor (306) discharging between pulses of the first error-delay-increase signal (370). The secondary error-delay signals (374) are generated based on output phase signals (330) from the VCB (308). The VCB (308) may be configured to generate 'x' number of signals, each of which is an output of a VCB delay element. However, the VCB (308) may be configured to provide less than 'x' number of signals as output phase signals (330) to the secondary correction circuit (390). In a particular embodiment, the signals from the VCB (308) chosen to comprise the output phase signals (330) provided to the secondary correction circuit (390) may be selected to have an equidistance phase separation. This equidistance selection results in the secondary correction circuit (390) generating secondary error-delay signals (374) evenly over a reference cycle. In the example of FIG. 6, four output phase signals (640-643) are generated with semi-equidistance phase separation. In this example, the rising edge of an output phase signal (640-643) causes an error generator (404) to generate a secondary error-delay signal (374).

For example, in response to detecting the rising edge (671) of the first output phase signal (640), one of the error generators (404) generates the secondary error-delay signal pulse (685), which in turn instructs the charge pump (304) to charge the filter capacitor (306), which results in the increase (681) in the VCB control signal (326). However, after the secondary error-delay signal pulse (685) ends, the filter capacitor (306) begins to discharge as is evident by the decline (671) in the VCB control signal (326). In response to detecting the rising edge (672) of the second output phase signal (641), one of the error generators (404) generates the secondary error-delay signal pulse (686), which results in the increase (682) in the VCB control signal (326). However, after the secondary error-delay signal pulse (686) ends, the filter capacitor (306)

begins to discharge as is evident by the decline (672) in the VCB control signal (326). By periodically instructing the charge pump (304) to charge the filter capacitor (306), the VCB control signal (326) generated by the filter capacitor (306) may remain accurate. Thus, the VCBs (308) receive proper delay adjustment information which improves the accuracy of the delay provided by the VCBs (308) to the phase of the output phase signals (330) and the feedback signal (328).

Figure 1:
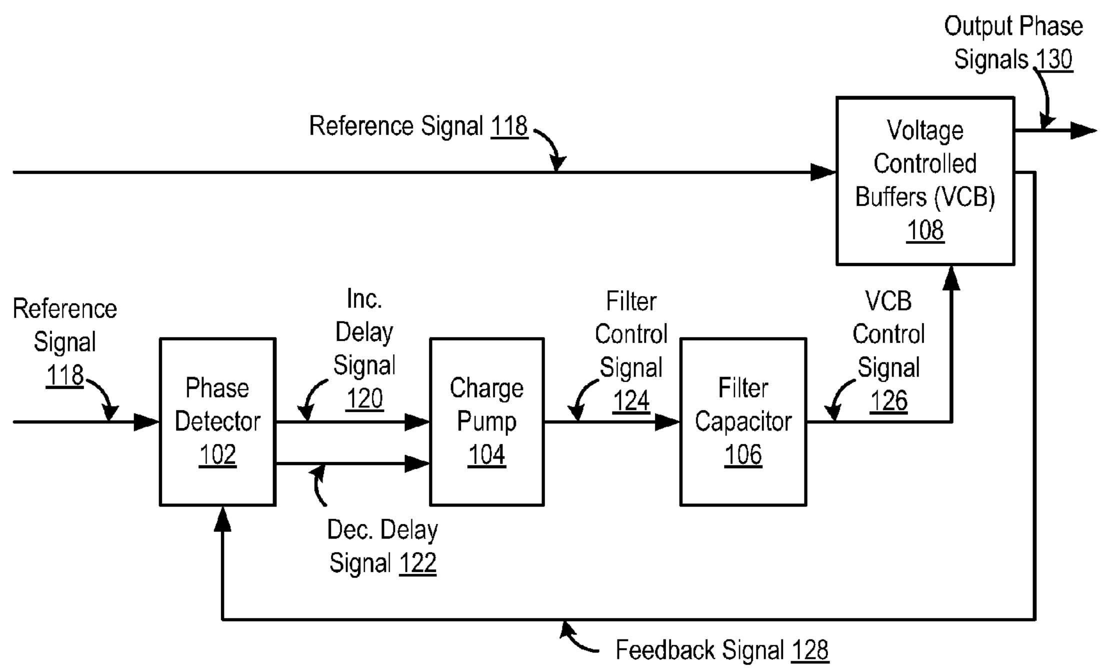
FIG. 1 sets forth a diagram of an example of a delay locked loop (DLL) circuit device found in the prior art.
Figure 2:
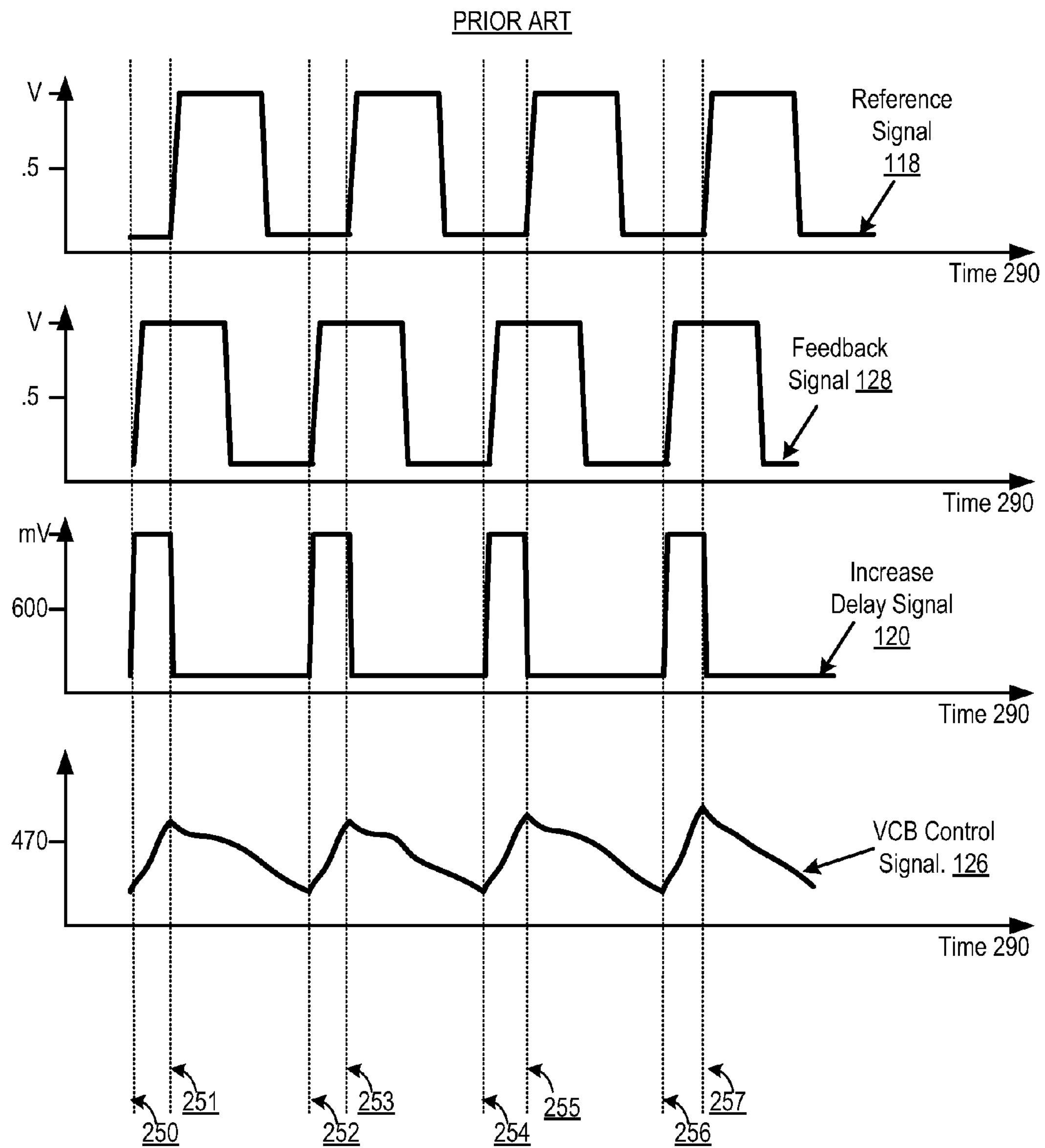
FIG. 2 sets forth a diagram illustrating an example of a transient response of the prior art DLL circuit device of FIG. 1.

The greater control and efficiency of a leakage tolerant DLL circuit device relative to the prior art DLL circuit device illustrated in FIG. 2 is further evident between the time point (652) and the time point (653) of FIG. 6. Between the time point (652) and the time point (653) in FIG. 6, the phase difference between the reference signal (318) and the feedback signal (328) decreases relative to the phase difference between the time point (252) and the time point (253) of in FIG. 2. Decreasing the phase difference reduces the pulse width of the first error-delay increase signal (370), as seen between the time point (652) and the time point (653). As a consequence of the VCB phase adjustments, the feedback signal (328) in FIG. 6 continues to delay shift until the rising edge of the reference signal (318) almost coincides with the rising edge of the feedback signal (328), as seen between the time point (656) and the time point (657). Although it is not illustrated, if the feedback signal were to over-shift, then the first error-delay-decrease signal (372) may be generated.

Figure 7:
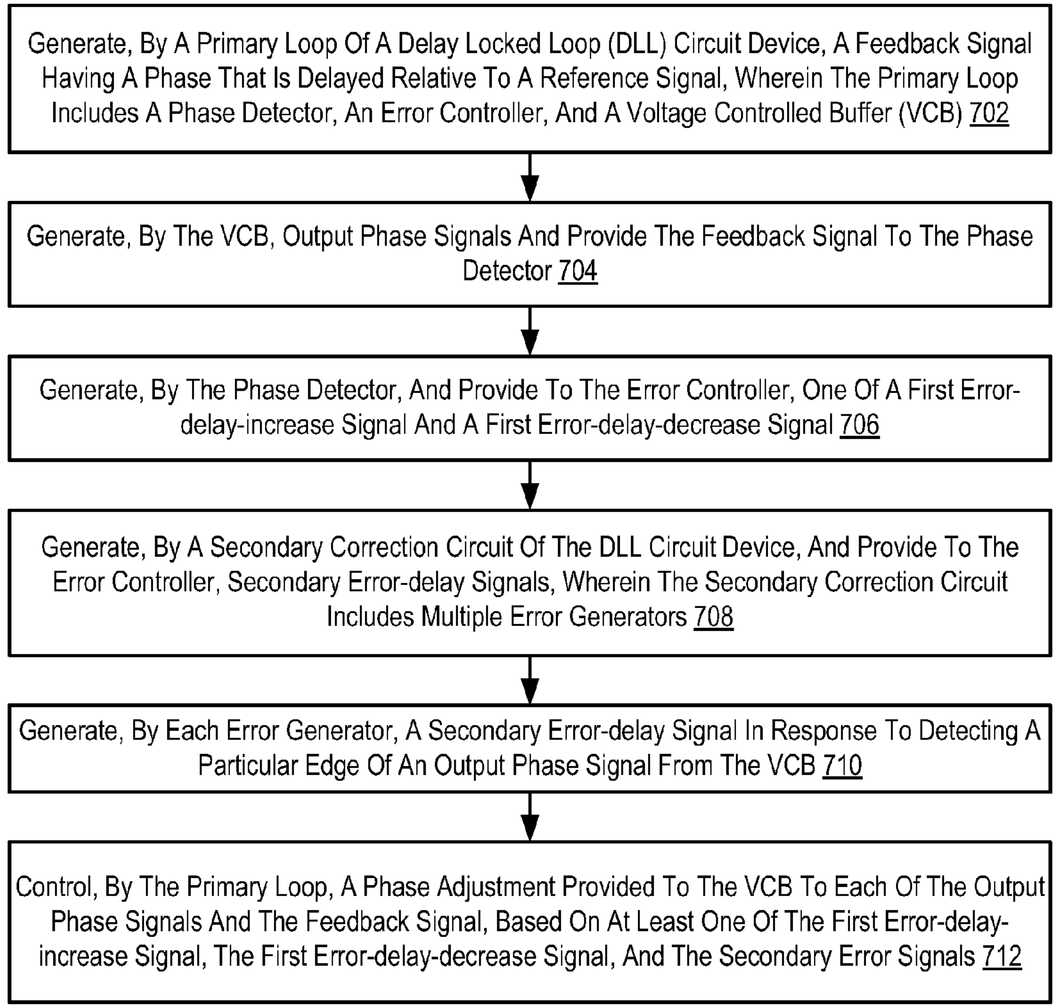
FIG. 7 sets forth a flowchart of an example of a method of locking phases of output phase signals to a phase of a reference signal using leakage tolerant DLL circuit devices according to embodiments of the present invention.

For further explanation, FIG. 7 sets forth a flowchart of an example of a method of locking phases of output phase signals to a phase of a reference signal using a leakage tolerant delay locked loop (DLL) circuit device according to embodiments of the present invention. By way of example, the method of FIG. 7 may utilize the leakage tolerant DLL circuit devices of FIGS. 3-5 and therefore the elements of FIGS. 3-5 are referenced in FIG. 7 for ease of explanation.

The method of FIG. 7 includes generating (702), by a primary loop (340) of a delay locked loop (DLL) circuit device, a feedback signal (328) having a phase that is delayed relative to a reference signal (318). Generating (702), by a primary loop (340) of a delay locked loop (DLL) circuit device, a feedback signal (328) having a phase that is delayed relative to a reference signal (318) may be carried out by voltage controlled buffers (308) delaying the reference signal (338) with delay elements and summing the delays of the delay elements to generate the feedback signal (328).

The method of FIG. 7 also includes generating (704), by the VCB (308), the output phase signals (330) and providing the feedback signal (328) to the phase detector (302). Generating (704), by the VCB (308), the output phase signals (330) and providing the feedback signal (328) to the phase detector (302) may be carried out generating an output phase signal from each delay element within the VCB (308) and the feedback signal (328) from the sum of the delays.

The method of FIG. 7 includes generating (706), by the phase detector (302), and providing to the error controller (354), one of a first error-delay-increase signal (370) and a first error-delay-decrease signal (372). Generating (706), by the phase detector (302), and providing to the error controller (354), one of a first error-delay-increase signal (370) and a first error-delay-decrease signal (372) may be carried out by comparing the reference signal (318) to the feedback signal (328) and determining a phase difference; determining a direction to shift the feedback signal (328); and generating one of the first error-delay-increase signal (370) and the first error-delay-decrease signal (372) based on the determination.

The method of FIG. 7 includes generating (708), by a secondary correction circuit (390) of the DLL circuit device, and providing to the error controller (354), secondary error-delay signals (374). Generating (708), by a secondary correction circuit (390) of the DLL circuit device, and providing to the error controller (354), secondary error-delay signals (374) may be carried out by determining an error width of the secondary error-delay signals (374); and in response to detecting a particular edge of an output phase signal, generating a secondary error-delay signal having the determined error width.

The method of FIG. 7 includes generating (710), by each error generator (404), a secondary error-delay signal (374) in response to detecting a particular edge of an output phase signal (330) from the VCB (308). Generating (710), by each error generator (404), a secondary error-delay signal (374) in response to detecting a particular edge of an output phase signal (330) from the VCB (308) may be carried out by examining an output phase signal for an indication of a particular type of edge.

The method of FIG. 7 includes based on at least one of the first error-delay-increase signal (370), the first error-delay-decrease signal (372), and the secondary error signals (374), controlling (712), by the primary loop (340), a phase adjustment provided by the VCB (308) to each of the output phase signals (330) and the feedback signal (328). Controlling (712), by the primary loop (340), a phase adjustment provided by the VCB (308) to each of the output phase signals (330) and the feedback signal (328) may be carried out by adjusting the delay created by each delay element within the VCB (308).

Figure 8:
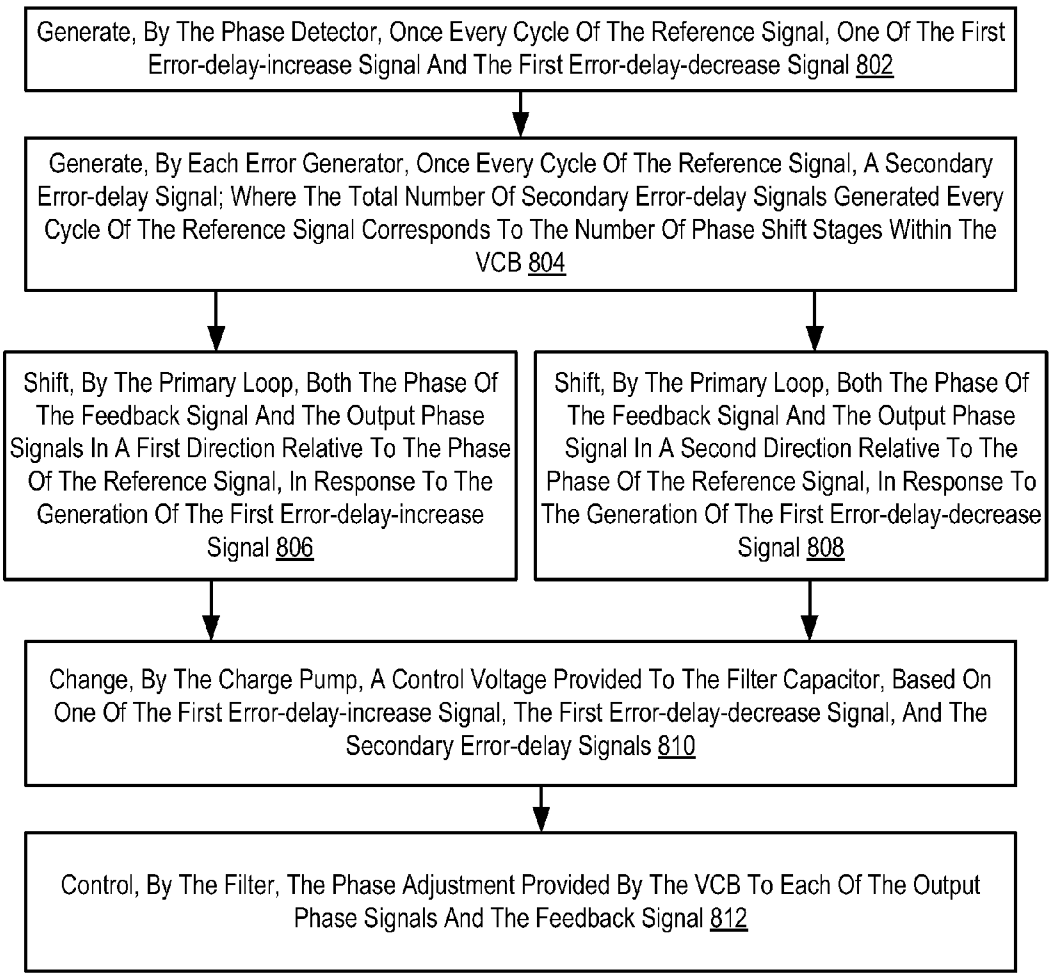
FIG. 8 sets forth a flowchart of another example of a method of locking phases of output phase signals to a phase of a reference signal using leakage tolerant DLL circuit devices according to embodiments of the present invention.

For further explanation, FIG. 8 sets forth a flowchart of another example of a method of locking phases of output phase signals to a phase of a reference signal using a leakage tolerant delay locked loop (DLL) circuit device according to embodiments of the present invention. By way of example, the method of FIG. 8 may utilize the leakage tolerant DLL circuit devices of FIGS. 3-5 and therefore the elements of FIGS. 3-5 are referenced in FIG. 8 for ease of explanation.

The method of FIG. 8 includes generating (802), by the phase detector (302), once every cycle of the reference signal (318), one of the first error-delay-increase signal (370) and the first error-delay-decrease signal (372). Generating (802), by the phase detector (302), once every cycle of the reference signal (318), one of the first error-delay-increase signal (370) and the first error-delay-decrease signal (372) may be carried out by comparing the reference signal (318) to the feedback signal (328); and determining a direction and amount of phase difference.

The method of FIG. 8 includes generating (804), by each error generator (404), once every cycle of the reference signal (318), a secondary error-delay signal (374). Generating (804), by each error generator (404), once every cycle of the reference signal (318), a secondary error-delay signal (374) may be carried out by in response to detecting a particular edge of an output phase signal, generating a secondary error-delay signal.

The method of FIG. 8 includes in response to the generation of the first error-delay-increase signal (370), shifting (806), by the primary loop (340), both the phase of the feedback signal (328) and the output phase signals (330) in a first direction relative to the phase of the reference signal (318). Shifting (806), by the primary loop (340), both the phase of the feedback signal (328) and the output phase signals (330) in a first direction relative to the phase of the reference signal (318) may be carried out instructing by the VCBs (308), the delay elements within the VCBs to increase the delay of the reference signal (318), thus increasing the delay of the resulting feedback signal (328) and output phase signals (330).

The method of FIG. 8 also includes in response to the generation of the first error-delay-decrease signal (372), shifting (808), by the primary loop (340), both the phase of the feedback signal (328) and the output phase signals (330) in a second direction relative to the phase of the reference signal (318). Shifting (808), by the primary loop (340), both the phase of the feedback signal (328) and the output phase signals (330) in a second direction relative to the phase of the reference signal (318) may be carried out by instructing by the VCBs (308), the delay elements within the VCBs to decrease the delay of the reference signal (318), thus decreasing the delay of the resulting feedback signal (328) and output phase signals (330).

The method of FIG. 8 includes based on one of the first error-delay-increase signal (370), the first error-delay-decrease signal (372), and the secondary error-delay signals (374), changing (810), by the charge pump (304), a control voltage (324) provided to the filter capacitor (306). Changing (810), by the charge pump (304), a control voltage (324) provided to the filter capacitor (306) may be carried out by charging a filter capacitor (306).

The method of FIG. 8 includes based on the control voltage (324), controlling (812), by the filter capacitor (306), the phase adjustment provided by the VCB (308) to each of the output phase signals (330) and the feedback signal (328). Controlling (812), by the filter capacitor (306), the phase adjustment provided by the VCB (308) to each of the output phase signals (330) and the feedback signal (328) may be carried out by instructing each of the delay elements of the VCB to change the delay provided to the output phase signals (330) and the feedback signal (328).

The flowchart and diagrams in the Figures illustrate the architecture, functionality, and operation of possible implementations of DLL circuit devices and methods according to various embodiments of the present invention. It should be noted that, in some alternative implementations, the functions noted in the blocks and flowcharts may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A leakage tolerant delay locked loop (DLL) circuit device, the DLL circuit device comprising:

a primary loop configured to generate a feedback signal having a phase that is delayed relative to a reference signal, wherein the primary loop includes a phase detector, an error controller, and a voltage controlled buffer (VCB), wherein the VCB is configured to generate a plurality of output phase signals and provide the feedback signal to the phase detector, wherein the phase detector is configured to generate and provide to the error controller, one of a first error-delay-increase signal and a first error-delay-decrease signal; and a secondary correction circuit configured to generate and provide secondary error-delay signals to the error controller, wherein the secondary correction circuit includes multiple error generators, wherein each error generator is configured to generate a secondary error-delay signal in response to detecting a particular edge of an output phase signal from the VCB, wherein the primary loop is configured to control a phase adjustment provided by the VCB to each of the output phase signals and the feedback signal, wherein the primary loop is configured to control the phase adjustment based on at least one of the first error-delay-increase signal, the first error-delay-decrease signal, and the secondary error-delay signals.

2. The DLL circuit device of claim 1 wherein the error controller includes a delay increase component that is coupled to the phase detector to receive the first error-delay-increase signal from the phase detector; and wherein the error controller includes a delay decrease component that is coupled to the phase detector to receive the first error-delay-decrease signal from the phase detector.

3. The DLL circuit device of claim 2 wherein all of the error generators of the secondary correction circuit are coupled to only one of the delay increase component and the delay decrease component of the error controller.

4. The DLL circuit device of claim 3 wherein all of the error generators of the secondary correction circuit are coupled to only one of the delay increase component and the delay decrease component in accordance with a direction of capacitor leakage in a filter included in the primary loop.

5. The DLL circuit device of claim 1 wherein in response to detecting the generation of the first error-delay-increase signal, the primary loop is configured to shift both the phase of the feedback signal and the output phase signals in a first direction relative to the phase of the reference signal; and wherein in response to detecting the generation of the first error-delay-decrease signal, the primary loop is configured to shift both the phase of the feedback signal and the output phase signal in a second direction relative to the phase of the reference signal.

6. The DLL circuit device of claim 5 wherein the amount that the primary loop is configured to shift the phase of the feedback signal and the output phase signals in the first direction is based on the pulse width of the first error-delay-increase signal; and wherein the amount that the primary loop is configured to shift the phase of the feedback signal and the output phase signals in the second direction is based on the pulse width of the first error-delay-decrease signal.

7. The DLL circuit device of claim 6 wherein the amount that the primary loop is configured to shift the phase of the feedback signal and the output phase signals in one of the first direction and the second direction is further based on pulse widths of the secondary error-delay signals received by the error controller from the error generators.

8. The DLL circuit device of claim 1 wherein the phase detector is configured to generate once every cycle of the reference signal, one of the first error-delay-increase signal and the first error-delay-decrease signal; wherein each error generator is configured to generate a secondary error-delay signal once every cycle of the reference signal.

9. The DLL circuit device of claim 1 wherein the primary loop further includes a charge pump and a filter capacitor; wherein the charge pump is configured to change a control voltage provided to the filter capacitor based on one of the first error-delay-increase signal, the first error-delay-decrease signal, and the secondary error-delay signals; wherein based on the control voltage, the filter capacitor is configured to control the phase adjustment provided by the VCB to each of the output phase signals and the feedback signal.

10. The DLL circuit device of claim 1 wherein the pulse width of each of the secondary error-delay signals corresponds to the pulse width of one of the first error-delay-increase signal and the first error-delay-decrease signal.

11. A method of locking phases of output phase signals to a phase of a reference signal using a leakage tolerant delay locked loop (DLL) circuit device, the method comprising:

generating, by a primary loop of the DLL circuit device, a feedback signal having a phase that is delayed relative to the reference signal; wherein the primary loop includes a phase detector, an error controller, and a voltage controlled buffer (VCB);

generating, by the VCB, the output phase signals and providing the feedback signal to the phase detector;

generating, by the phase detector, and providing to the error controller, one of a first error-delay-increase signal and a first error-delay-decrease signal;

generating, by a secondary correction circuit of the DLL circuit device, and providing to the error controller, secondary error-delay signals; wherein the secondary correction circuit includes multiple error generators;

generating, by each error generator, a secondary error-delay signal in response to detecting a particular edge of an output phase signal from the VCB; and based on at least one of the first error-delay-increase signal, the first error-delay-decrease signal, and the secondary error signals, controlling, by the primary loop, a phase adjustment provided by the VCB to each of the output phase signals and the feedback signal.

12. The method of claim 11 wherein the error controller includes a delay increase component that is coupled to the phase detector to receive the first error-delay-increase signal from the phase detector; and wherein the error controller includes a delay decrease component that is coupled to the phase detector to receive the first error-delay-decrease signal from the phase detector.

13. The method of claim 12 wherein all of the error generators of the secondary correction circuit are coupled to only one of the delay increase component and the delay decrease component.

14. The method of claim 13 wherein the error generators of the secondary correction circuit are coupled to only one of the delay increase component and the delay decrease component in accordance with a direction of capacitor leakage in a filter capacitor included in the primary loop.

15. The method of claim 11 further comprising:

in response to the generation of the first error-delay-increase signal, shifting, by the primary loop, both the phase of the feedback signal and the output phase signals in a first direction relative to the phase of the reference signal; and in response to the generation of the first error-delay-decrease signal, shifting, by the primary loop, both the phase of the feedback signal and the output phase signal in a second direction relative to the phase of the reference signal.

16. The method of claim 15 wherein the amount that the primary loop shifts the phase of the feedback signal and the output phase signals in the first direction is based on the pulse width of the first error-delay-increase signal; and wherein the amount that the primary loop shifts the phase of the feedback signal and the output phase signals in the second direction is based on the pulse width of the first error-delay-decrease signal.

17. The method of claim 16 wherein the amount that the primary loop shifts the phase of the feedback signal and the output phase signals in one of the first direction and the second direction is further based on pulse widths of the secondary error-delay signals received by the error controller.

18. The method of claim 11 further comprising:

generating, by the phase detector, once every cycle of the reference signal, one of the first error-delay-increase signal and the first error-delay-decrease signal; and generating, by each error generator, once every cycle of the reference signal, a secondary error-delay signal.

19. The method of claim 11 wherein the primary loop further includes a charge pump and a filter capacitor; and the method further comprising:

based on one of the first error-delay-increase signal, the first error-delay-decrease signal, and the secondary error-delay signals, changing, by the charge pump, a control voltage provided to the filter capacitor; and based on the control voltage, controlling, by the filter capacitor, the phase adjustment provided by the VCB to each of the output phase signals and the feedback signal.

20. The method of claim 11 wherein the pulse width of each of the secondary error-delay signals corresponds to the pulse width of one of the first error-delay-increase signal and the first error-delay-decrease signal.

* * * * *